United States Patent
Schreibman et al.

(10) Patent No.: US 10,650,839 B2
(45) Date of Patent: May 12, 2020

(54) INFINITE IMPULSE RESPONSE ACOUSTIC ECHO CANCELLATION IN THE FREQUENCY DOMAIN

(71) Applicant: Intel Corporation, Santa Clara, CA (US)

(72) Inventors: Amos Schreibman, Hod Hasharon (IL); Shmuel Markovich-Golan, Ramat Hasharon (IL)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/447,526

(22) Filed: Jun. 20, 2019

(65) Prior Publication Data

US 2019/0304482 A1    Oct. 3, 2019

(51) Int. Cl.
*G10L 21/0232* (2013.01)
*G10L 21/0264* (2013.01)
(Continued)

(52) U.S. Cl.
CPC ...... *G10L 21/0232* (2013.01); *G10L 21/0264* (2013.01); *H03H 17/04* (2013.01);
(Continued)

(58) Field of Classification Search
CPC ............ G10L 21/0232; G10L 21/0264; G10L 21/0208; G10L 2021/02163;
(Continued)

(56) References Cited

U.S. PATENT DOCUMENTS

| 5,475,731 A * | 12/1995 | Rasmusson | H04M 9/082 379/3 |
| 6,744,887 B1 * | 6/2004 | Berstein | H04B 3/23 370/290 |

(Continued)

OTHER PUBLICATIONS

Polack, Jean-Dominique. "Playing billiards in the concert hall: The mathematical foundations of geometrical room acoustics." Applied Acoustics 38, No. 2-4 (1993): 235-244.
(Continued)

*Primary Examiner* — Ahmad F. Matar
*Assistant Examiner* — Sabrina Diaz
(74) *Attorney, Agent, or Firm* — Finch & Maloney PLLC

(57) ABSTRACT

Techniques are provided for reduction of echo in a received audio signal based on infinite impulse response (IIR) acoustic echo cancellation in the frequency domain. A methodology implementing the techniques according to an embodiment includes estimating an echo path transfer function associated with the received audio signal. The received audio signal includes a combination of a speech signal and a reference signal modified by the echo path transfer function. The estimation employs an IIR filter and a finite impulse response (FIR) filter, both of which operate in the frequency domain. The IIR filter is configured to model longer term echo components and the FIR filter is configured to model shorter term echo components. The method further includes applying the filters to the reference signal to generate an echo correction signal which is subtracted from the received audio signal to reduce the echo and generate an estimate of the speech signal.

21 Claims, 6 Drawing Sheets

(51) Int. Cl.
*H04R 3/02* (2006.01)
*H03H 17/04* (2006.01)
*G10L 21/0216* (2013.01)
*H03H 17/00* (2006.01)

(52) U.S. Cl.
CPC ...... *H04R 3/02* (2013.01); *G10L 2021/02163* (2013.01); *G10L 2021/02168* (2013.01); *H03H 2017/009* (2013.01)

(58) Field of Classification Search
CPC . G10L 2021/02168; G10L 2021/02082; G10L 2021/02165; H03H 17/04; H03H 2017/009; H04R 3/02; H04R 3/00; H04R 3/04; H04R 3/005; H04R 2430/03; H04R 2410/07; G10K 11/17; H04M 9/082; H04B 3/23; G11B 20/24
USPC .................................................. 381/94.1, 66
See application file for complete search history.

(56) References Cited

U.S. PATENT DOCUMENTS

| | | | |
|---|---|---|---|
| 7,068,780 B1 * | 6/2006 | Levonas | H04B 3/23 370/268 |
| 2014/0177859 A1 * | 6/2014 | Ahgren | H04M 9/082 381/71.1 |
| 2017/0287502 A1 * | 10/2017 | Buck | G10L 21/0208 |

OTHER PUBLICATIONS

M. Dentino, J. McCool, and B. Widrow, "Adaptive filtering in the frequency domain," Proceedings of the IEEE, vol. 66, No. 12, pp. 1658-1659, Dec. 1978.
E Ferrara, "Fast implementations of LMS adaptive filters," IEEE Transactions on Acoustics, Speech, and Signal Processing, vol. 28, No. 4, pp. 474-475, Aug. 1980.
J. J. Shynk, "Adaptive IIR filtering," IEEE Assp Magazine, vol. 6, No. 2, pp. 4-21, 1989.
M. Karjalainen, P. A. A. Esquef, P. Antsalo, A. Makivirta, and V. Valimaki, "AR/ARMA analysis and modeling of modes in resonant and reverberant systems," in Audio Engineering Society Convention 112, Apr. 2002. [Online]. Available: http://www.aes.org/elib/browse.cfm?elib=11329.
S. J. Schlecht and E. A. Habets, "Modal decomposition of feedback delay networks," arXiv preprint arXiv:1901.08865, 2019.
D. Beaton and N. Xiang, "Room acoustic modal analysis using Bayesian inference," The Journal of the Acoustical Society of America, vol. 141, No. 6, p. 4480-4493, Jun. 2017. [Online]. Available: http://dx.doi.org/10.1121/1.4983301.
S. J. Schlecht and E. A. Habets, "Time-varying feedback matrices in feedback delay networks and their application in artificial reverberation," The Journal of the Acoustical Society of America, vol. 138, No. 3, pp. 1389-1398, 2015.
Y. Haneda, S. Makino, and Y. Kaneda, "Common acoustical pole and zero modeling of room transfer functions," IEEE Transactions on Speech and Audio Processing, vol. 2, No. 2, p. 320-328, Apr. 1994. [Online]. Available: http://dx.doi.org/10.1109/89.279281.
J. R. Mohammed and G. Singh, "An efficient RLS algorithm for output-error adaptive IIR filtering and its application to acoustic echo cancellation," in 2007 IEEE Symposium on Computational Intelligence in Image and Signal Processing. IEEE, 2007, pp. 139-145.
A. P. Liavas and P. A. Regalia, "Acoustic echo cancellation: Do IIR models offer better modeling capabilities than their FIR counterparts?" IEEE Transactions on signal processing, vol. 46, No. 9, pp. 2499-2504, 1998.
T. Nakatani, T. Yoshioka, K. Kinoshita, M. Miyoshi, and B. Juang, "Blind speech dereverberation with multi-channel linear prediction based on short time Fourier transform representation," in 2008 IEEE International Conference on Acoustics, Speech and Signal Processing, Mar. 2008, pp. 85-88.
Y. Avargel and I. Cohen, "System identification in the short-time Fourier transform domain with crossband filtering," IEEE Transactions on Audio, Speech, and Language Processing, vol. 15, No. 4, pp. 1305-1319, May 2007.
J.-S. Soo and K. K. Pang, "Multidelay block frequency domain adaptive filter," IEEE Transactions on Acoustics, Speech, and Signal Processing, vol. 38, No. 2, pp. 373-376, 1990.
E. Hadad, F. Heese, P. Vary, and S. Gannot, "Multichannel audio database in various acoustic environments," in Acoustic Signal Enhancement (IWAENC), 2014 14th International Workshop on. IEEE, 2014, pp. 313-317.
M. R. Schroeder, "Integrated-impulse method measuring sound decay without using impulses," The Journal of the Acoustical Society of America, vol. 66, No. 2, pp. 497-500, 1979.

* cited by examiner

INFINITE IMPULSE RESPONSE ACOUSTIC ECHO CANCELLATION IN THE FREQUENCY DOMAIN

BACKGROUND

Acoustic echo cancellation is of fundamental importance in speech processing applications, such as hands-free voice communication and speech recognition, to name just two examples. Typically, in these applications, a system includes one or more microphones and speakers. The microphones capture the desired speech signal (e.g., the voice of a human user of the system) as well as acoustic echo. The acoustic echo may include signals emitted through the speakers and propagated through the environment in a manner that can be influenced by a number of complex and time-varying factors, thus making echo cancellation difficult. Nonetheless, sufficient cancellation of the echo signal is crucial for enhancing the quality, intelligibility and identifiability of the desired speech signal.

Figure 1:
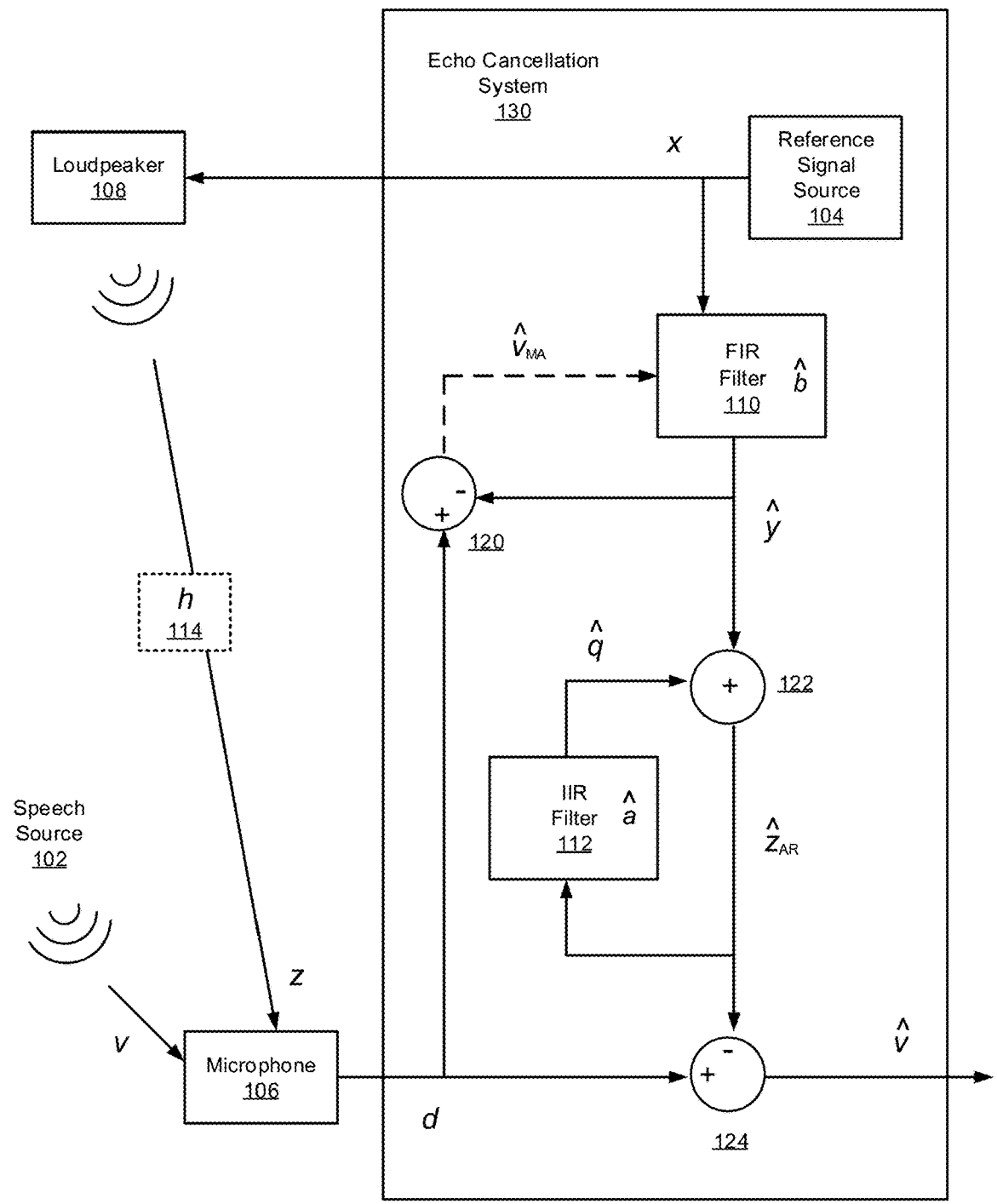
FIG. 1 is a top-level block diagram of an echo cancellation system, configured in accordance with certain embodiments of the present disclosure.

Although the following Detailed Description will proceed with reference being made to illustrative embodiments, many alternatives, modifications, and variations thereof will be apparent in light of this disclosure.

DETAILED DESCRIPTION

Techniques are provided for reduction of echo in a received audio signal, based on infinite impulse response (IIR) acoustic echo cancellation in the frequency domain, to enhance the speech component of the received audio signal. Many devices and platforms which are configured to process audio signals, receive signals that include a speech component of interest but which are also corrupted by acoustic echo. For example, during a phone conversation in speakerphone mode, a combination of echoes of the audio emitted through the phone's speaker (referred to herein as a reference signal), serve to corrupt the speech signal of interest generated by the user of the phone. Acoustic echo induced on the reference signal, as it propagates through the environment, is affected by many factors, including the frequency response of the speakers, the direct-path between speakers and microphones, reflections of the signal off objects and boundaries of the environment, and the frequency response of the microphones. These factors are generally complex and time-varying. Example embodiments of the present disclosure provide techniques for estimating the acoustic echo and correcting for such echo, through the use of IIR and finite impulse response (FIR) filters, operating in the frequency domain. This results in improved performance of speech processing applications that may subsequently operate on that signal and/or simply allows a cleaner speech signal to be transmitted on to a destination such as the remote party of a phone call.

The disclosed techniques can be implemented, for example, in a computing system or a software product executable or otherwise controllable by such systems, although other embodiments will be apparent. The system or product is configured to perform reduction of echo in a received audio signal based on IIR acoustic echo cancellation in the frequency domain. In accordance with an embodiment, a methodology to implement these techniques includes estimating an echo path transfer function associated with the received audio signal. The received audio signal includes a combination of a speech signal and a reference signal modified by the echo path transfer function. The estimation employs an IIR filter (also referred to as a feedback filter, an auto regressive filter, or an AR filter) and an FIR filter (also referred to as a feedforward filter, a moving average filter, or an MA filter), both of which operate in the frequency domain, which provides improved computational efficiency, as will be explained below. The IIR filter is configured to model longer term echo components and the FIR filter is configured to model shorter term echo components. The method further includes applying the filters to the reference signal to generate an echo correction signal which is subtracted from the received audio signal to reduce the echo and generate an estimate of the speech signal. In some embodiments, the method further includes detecting instability associated with the IIR filter, using an efficient variance calculation, and resetting the filter to correct for such detected instability, as needed.

As will be appreciated, the techniques described herein may provide improved echo reduction/cancellation with increased computational efficiency, compared to existing techniques which typically either use a simplified echo path transfer function that fails to adequately capture the complexities of the environment, or use a transfer function that is too computationally intensive for many practical applications. The disclosed techniques can be implemented on a broad range of platforms including smartphones, smart-speakers, laptops, tablets, video conferencing systems, gaming systems, smart home control systems, and robotic systems. These techniques may further be implemented in hardware or software or a combination thereof.

FIG. 1 is a top-level block diagram 100 of an echo cancellation system 130, configured in accordance with certain embodiments of the present disclosure. The echo cancellation system 130 is shown to include a reference signal source 104, an FIR filter 110, an IIR filter 112, and summing (or subtracting) circuits 120, 122, and 124. In some embodiments, the echo cancellation system 130 may be incorporated in a voice-enabled device platform 600, as will be described in greater detail in connection with FIG. 6, which may further include a speaker 108, and a microphone 106.

The operation of the echo cancellation system 130 will be described in greater detail below, but at a high-level, the reference signal source 104 is configured to generate a reference signal x(t) for broadcast through the speaker 108. The broadcast reference signal is modified by the environment (for example, the room and objects contained in the room), which introduces reverberation. The environment is modeled by the echo acoustic impulse response (AIR) h(t) 114, also referred to as an echo path transfer function in the frequency domain, which, when applied to the broadcast reference signal x(t), results in the modified or reverberated signal z(t) presented at the microphone 106. The microphone thus provides a summation of the desired speech or voice signal v(t) with the reverberated reference signal z(t). The resulting summation is the received signal, designated d(t), which is provided to the echo cancellation system 130. The echo cancellation system is configured to estimate the echo path transfer function and apply that transfer function to the known reference signal to generate an echo cancellation or correction term (which approximates z(t)), that can be subtracted from the received signal d(t) to provide an improved estimate of the voice signal v(t). Thus, the echo cancellation system 130 is configured to extract the desired voice signal v(t) from the microphone signal d(t) given a known reference signal x(t). The estimation of the echo path transfer function is accomplished through the use of FIR and IIR filters, operating in the frequency domain, as will be explained below.

In some embodiments, the voice-enabled device platform may be a smartphone, a smart-speaker, a speech enabled entertainment system, a speech enabled home management system, or any system capable of broadcasting audio through the speaker 108 while simultaneously receiving audio through one or more microphones 106. For example, in the case of a smartphone operating in speakerphone mode, the speaker 108 is configured to broadcast audio, x(t), associated with the remote side of the conversation (which serves as the reference signal source 104), while the microphone 106 is configured to receive audio containing speech from a user, v(t), (i.e., the speech source 102) on the local side of the conversation (e.g., in the room with the smartphone). Alternatively, in the case of a smart-speaker or a speech enabled entertainment system, the speaker 108 may broadcast the reading of an audio book as the reference signal x(t), for example, while the microphone 106 is configured to receive speech commands, v(t), from the user, such as, "skip to the next chapter," "speak louder," or "stop reading and play music," to give just a few examples. In either case, echoes of the reference signal serve as an undesirable interfering signal, z(t), which is a corrupting component of the received signal d(t) provided by the microphone 106.

In the following discussions, time domain signals are designated with the time index t, for example v(t) for the voice signal in the time domain. Frequency domain signals are designated with the indices n and k, for example v(n,k) for the voice signal in the frequency domain, where n denotes the time-frame index and k denotes the frequency bin index. For notational simplicity, however, the frequency bin index k is usually omitted from the equations, and thus v(n) will indicate the voice signal in the frequency domain. It will be appreciated that conversion of signal from the time domain to the frequency domain can be accomplished with a Short Time Fourier Transform (STFT), or other suitable technique. Likewise, conversion from the frequency domain back to the time domain can be accomplished with an inverse STFT, or other suitable technique.

The Acoustic Impulse Response (AIR) can be considered to include two components. The first component, denoted "early," contains the direct path and early reflections which are relatively sparse in time. The length of this component is referred to as the mixing time and can be approximated in ms units as the square-root of the room volume in cubic meters ($m^3$). The second component, denoted "late," contains higher-order reflections and has an infinitely long tail, as reflections may continue indefinitely, although they will decrease in amplitude. The late component can be modeled as a white-Gaussian process with exponentially decaying amplitude.

The echo path transfer function h(t) 114 in a reverberant environment can be modeled as an Auto Regressive (AR) process in the STFT (frequency) domain. Frequency domain implementation benefits from the diagonalization property of the Fourier transform, which allows for independent estimation of the echo path transfer function at each frequency. The AR process (e.g., employing an IIR filter) enables the system to capture the late component of the infinitely long AIR with a finite order filter model. The finite number of poles defines the order of the feedback filter, which captures the infinite tail of the AIR. The use of an IIR filter thus requires far fewer parameters than a system that employs an FIR filter alone.

The estimate of the echo component z(n) is formulated as an AR process, which can be expressed for example by the following equation:

$$\hat{z}_{AR}(n) = \hat{y}(n) + \hat{q}(n)$$

Where $\hat{y}(n)$ is the output of the FIR filter 110, which will be described below, and $\hat{q}(n)$ is the output of the IIR filter 112, which can be expressed by the following equation:

$$\hat{q}(n) \triangleq \sum_{i=1}^{N_a} \hat{a}(i)\hat{z}_{AR}(n-i)$$

The calculation and update process of the $N_a$ IIR coefficients $\hat{a}(i)$ is described in greater detail below in connection with FIG. 3.

The FIR filter 110 is configured to capture the early component of the AIR, and the implementation can be expressed, for example, by the following equation:

$$\hat{y}(n) \triangleq \hat{b}^T x(n)$$

The calculation and update process of the FIR coefficients $\hat{b}$ is described in greater detail below in connection with FIG. 2.

Figure 2:
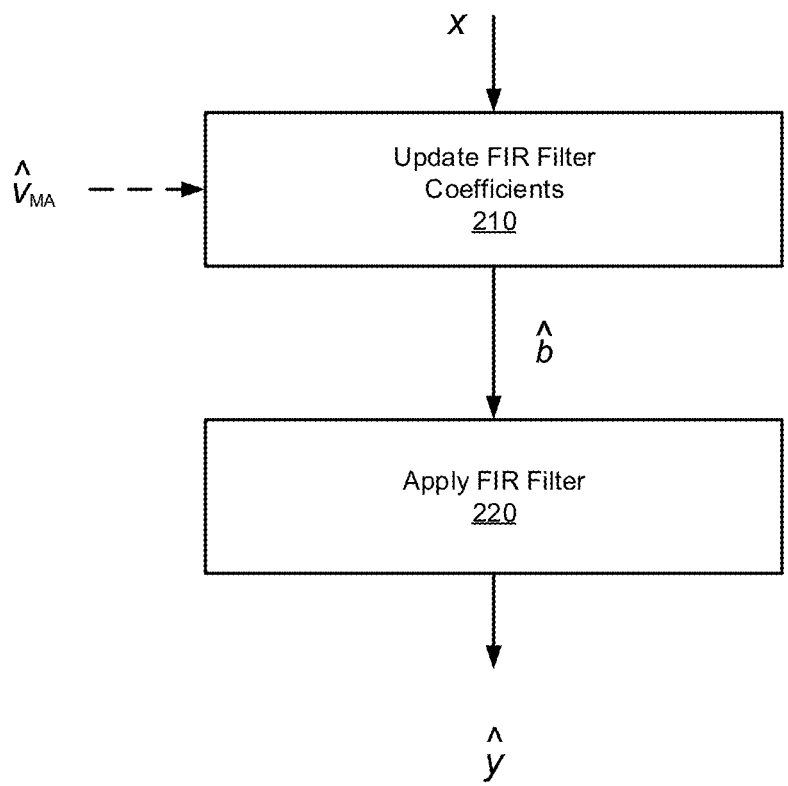
FIG. 2 is a more detailed block diagram of the operations of the finite impulse response (FIR) filter, configured in accordance with certain embodiments of the present disclosure.

FIG. 2 is a more detailed block diagram of the operations of the finite impulse response (FIR) filter 110, configured in accordance with certain embodiments of the present disclosure. The FIR filter is also referred to as a moving average (MA) filter. The FIR filter coefficients are estimated prior to, and independently from, the IIR filter coefficients, which provides for a more robust filter. The order of the FIR filter (i.e., number of coefficients $N_b$), equivalent to the order of the MA part of the echo signal model, may be chosen to be longer than the early part of the AIR. In some embodiments, the FIR filter is a minimum mean squared error estimator, configured to minimize the variance of the estimated desired signal (e.g., the voice signal), designated as $\hat{v}_{MA}$, for moving average voice signal estimate. Such a filter is also known as a Wiener filter. The FIR coefficients $\hat{b}$ may be calculated and updated at operation 210, for example, according to the following equations:

$$\hat{b} \triangleq \hat{h} = (R_{xx}^{-1} r_{xd})^*$$

where $$r_{xd}(l) = E[x(n-l)d^*(n)]$$

$$R_{xx}(i,j) = E[x(n-i)x^*(n-j)]$$

and E[•] is the expected value operation. The FIR filter is then applied, at operation 220, according to the following equation:

$$\hat{y}(n) \triangleq \hat{b}^T x(n)$$

In some embodiments, the FIR output is calculated first, followed by the update of the filter weights coefficients. Summing circuit 120 generates $\hat{v}_{MA}$ as the difference between d(n) and ŷ(n). The dotted line indicates that $\hat{v}_{MA}$ controls the state of the FIR filter 110, as it is the factor being minimized by the filter.

Figure 3:
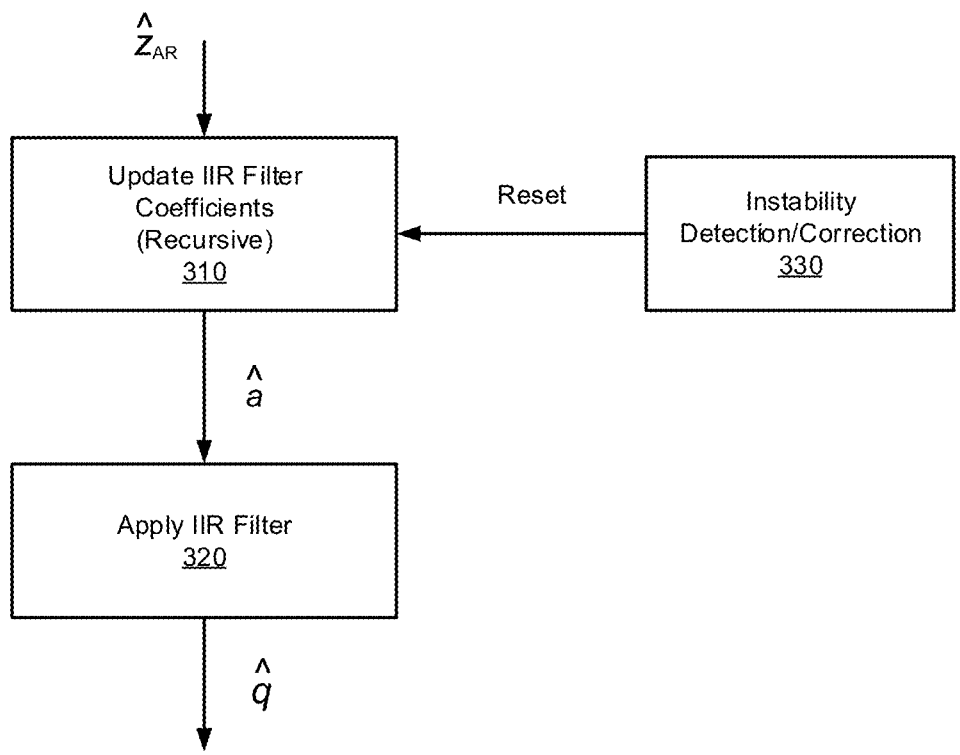
FIG. 3 is a more detailed block diagram of the operations of the infinite impulse response (IIR) filter, configured in accordance with certain embodiments of the present disclosure.

FIG. 3 is a more detailed block diagram of the operations of the infinite impulse response (IIR) filter 112a, configured in accordance with certain embodiments of the present disclosure. The IIR filter is also referred to as auto regressive (AR) filter. The IIR coefficients â may be calculated and updated recursively at operation 310, for example, according to the following equation:

$$\hat{a} = (R_{yd}^{-1} r_{yq})^*$$

based on second order moment estimates (obtained, for example, by recursive averaging):

$$\hat{r}_{yq}(l, n) = \alpha \hat{r}_{yq}(l, n-1) + (1-\alpha)\hat{y}(n-l)\hat{q}^*(n)$$

$$\hat{r}_{yd}(l, n) = \alpha \hat{r}_{yd}(l, n-1) + (1-\alpha)\hat{y}(n-l)d^*(n)$$

$$R_{yd} \triangleq \begin{bmatrix} r_{yd}(0) & 0 & \cdots & 0 \\ r_{yd}(1) & r_{yd}(0) & \cdots & 0 \\ \vdots & \vdots & \ddots & \vdots \\ r_{yd}(N_a-1) & r_{yd}(N_a-2) & \cdots & r_{yd}(0) \end{bmatrix}$$

The recursive terms are initialized to zero (e.g., for n=0). In some embodiments, in order to reduce estimation error, the second order moment estimates are taken when there is no desired speech signal present, as this would represent interference with the echo path estimation.

The feedback component q̂(n) is generated, at operation 320, by applying the filter coefficients â to the AR estimate of z(n), which is designated $\hat{z}_{AR}$. This may be expressed, for example, by the following equation:

$$\hat{q}(n) \triangleq \sum_{i=1}^{N_a} \hat{a}(i) \hat{z}_{AR}(n-i)$$

The order of the IIR filter (i.e., number of coefficients $N_a$) may be chosen to fit the acoustic model of the environment. Summing circuit 122 generates $\hat{z}_{AR}$ as the sum of q̂ and ŷ. Summing circuit 124 generates the estimate of the desired voice signal by subtracting the estimated echo component $\hat{z}_{AR}$ from the received audio signal d(n) from the microphone. This may be expressed, for example, by the following equation:

$$\hat{v}(n) = d(n) - \hat{z}_{AR}(n)$$

An inverse STFT may then be applied to v̂(n) to generate v̂(t) in the time domain.

Instability detection/correction circuit 330 is configured to detect instability associated with the IIR filter. The IIR filter may become unstable if any of the filter poles reside outside of the unit circle. Instability in any given frequency will result in exponentially increasing energy which will eventually corrupt the estimated desired signal. Instability can be avoided by checking the positions of the IIR filter poles, however this operation is computationally expensive. Thus, in some embodiments, instability is detected based on a comparison of the short-term variance of the estimated speech signal to the short-term variance of the difference between the received audio signal and an output of the FIR filter. For example, it is expected that $$\mathrm{Var}\{\hat{v}(n)\} \leq \mathrm{Var}\{d(n) - \hat{y}(n)\}$$

where Var {•} stands for short-term variance estimate. If this condition fails, the estimated IIR filter coefficients are reset to zero and the echo is temporarily estimated by $z_{AR}(n) \approx \hat{y}(n)$, until stability is restored/achieved.

Figure 4:
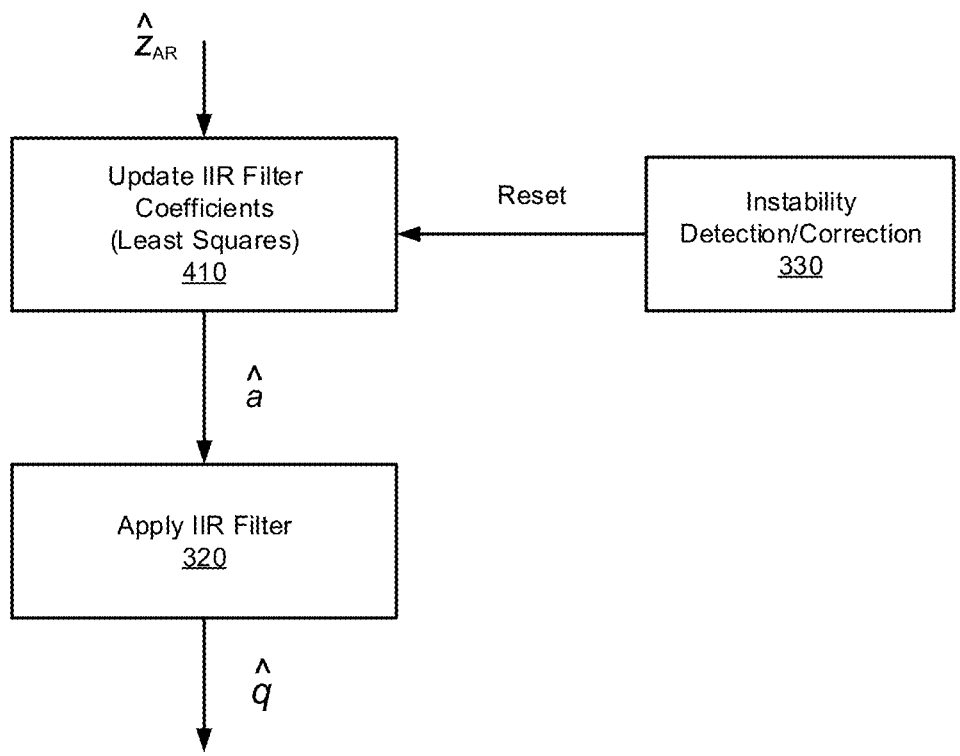
FIG. 4 is a more detailed block diagram of the operations of the infinite impulse response (IIR) filter, configured in accordance with certain other embodiments of the present disclosure.

FIG. 4 is a more detailed block diagram of the operations of the infinite impulse response (IIR) filter 112b, configured in accordance with certain other embodiments of the present disclosure. In this embodiment, an alternative calculation of the IIR coefficients â, described previously, may be calculated and updated, using a least squares solution at operation 410, for example, according to the following equation:

$$\hat{a} = (R_{dd}^{-1} r_{de})^*$$

where $$r_{de}(l) = E[d(n-l)v_{MA}^*(n)]$$

$$R_{dd}(i,j) = E[d(n-i)d^*(n-j)]$$

Methodology

Figure 5:
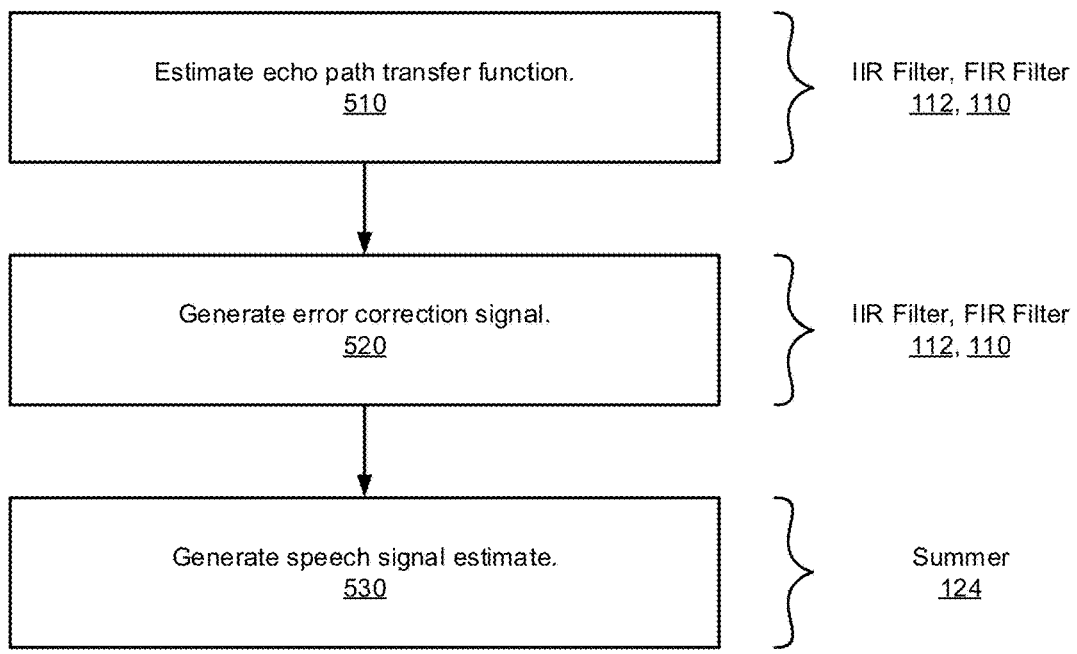
FIG. 5 is a flowchart illustrating a methodology for echo cancellation, in accordance with certain embodiments of the present disclosure.

FIG. 5 is a flowchart illustrating an example method 500 for providing reduction of echo in a received audio signal based on IIR acoustic echo cancellation in the frequency domain, in accordance with certain embodiments of the present disclosure. As can be seen, the example method includes a number of phases and sub-processes, the sequence of which may vary from one embodiment to another. However, when considered in the aggregate, these phases and sub-processes form a process for echo cancellation, in accordance with certain of the embodiments disclosed herein. These embodiments can be implemented, for example, using the system architecture illustrated in FIGS. 1-4, as described above. However other system architectures can be used in other embodiments, as will be apparent in light of this disclosure. To this end, the correlation of the various functions shown in FIG. 5 to the specific components illustrated in the other figures is not intended to imply any structural and/or use limitations. Rather, other embodiments may include, for example, varying degrees of integration wherein multiple functionalities are effectively performed by one system. For example, in an alternative embodiment a single module having decoupled sub-modules can be used to perform all of the functions of method 500. Thus, other embodiments may have fewer or more modules and/or sub-modules depending on the granularity of implementation. In still other embodiments, the methodology depicted can be implemented as a computer program product including one or more non-transitory machine-readable mediums that when executed by one or more processors cause the methodology to be carried out. Numerous variations and alternative configurations will be apparent in light of this disclosure.

As illustrated in FIG. 5, in an embodiment, method 500 for echo cancellation commences by estimating, at operation 510, an echo path transfer function associated with the received audio signal. The received audio signal includes a combination of a speech signal and a reference signal modified by the echo path transfer function. The estimation employs an IIR filter and an FIR filter, both of which operate in the frequency domain. The IIR filter is configured to model longer term echo components and the FIR filter is configured to model shorter term echo components, as previously described. In some embodiments, the coefficients of the IIR filter are generated based on recursive estimates of second order statistics of the reference signal and the received audio signal. In some embodiments, the coefficients of the FIR filter are generated based on a least squares minimization of variance of an estimate of the speech signal.

Next, at operation 520, the IIR filter and the FIR filter are applied to the reference signal to generate an echo correction signal. At operation 530, the echo correction signal is summed to the received audio signal to reduce the echo in the received audio signal to generate an estimate of the speech signal.

Of course, in some embodiments, additional operations may be performed, as previously described in connection with the system. For example, instability associated with the IIR filter may be detected based on a comparison of the short-term variance of the estimated speech signal to the short-term variance of the difference between the received audio signal and an output of the FIR filter. The coefficients of the IIR filter may be reset to zero values in response to the instability detection. In some embodiments, the estimates of the second order statistics of the received audio signal are performed during time periods associated with an absence of the speech signal.

Example System

Figure 6:
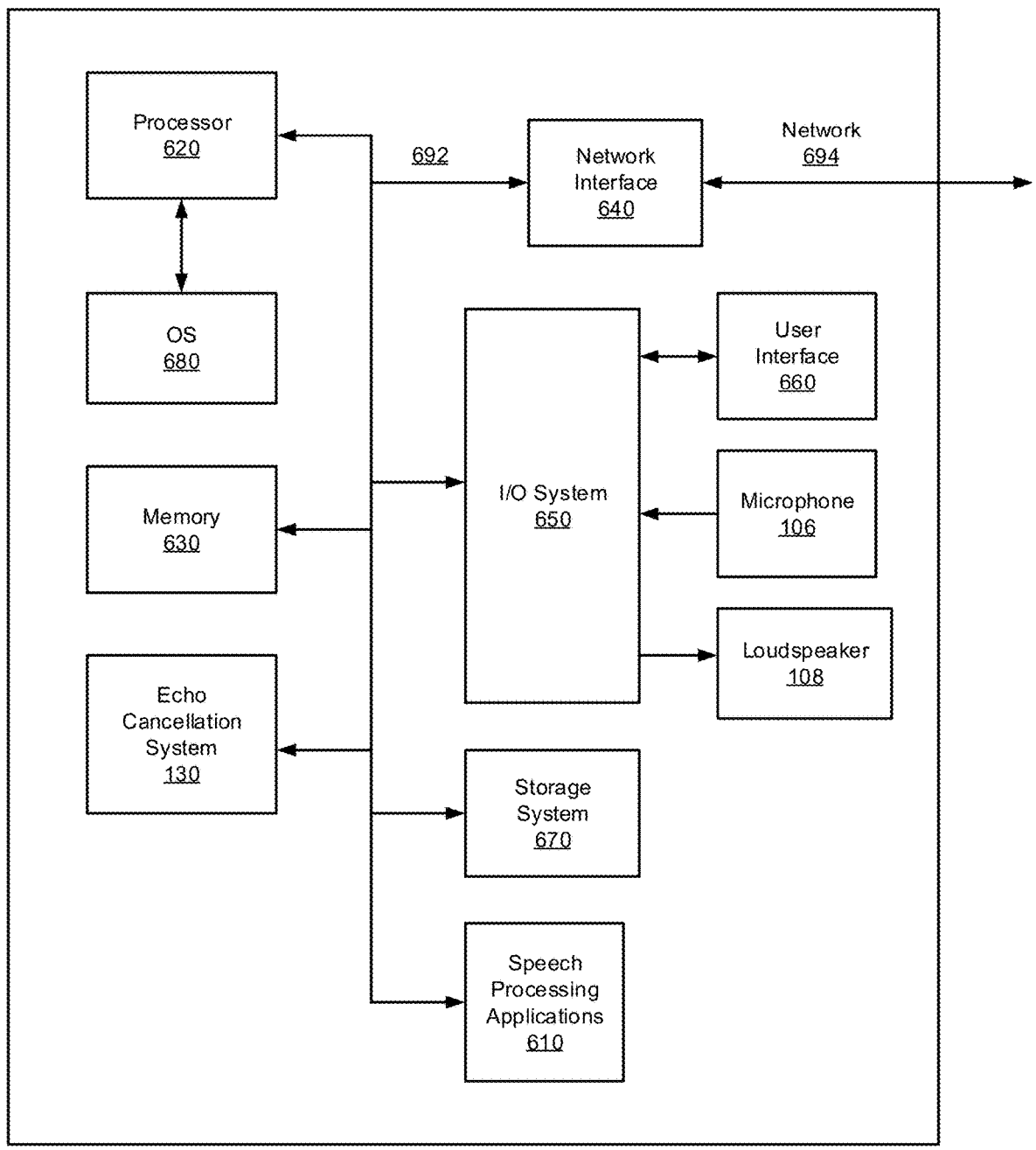
FIG. 6 is a block diagram schematically illustrating a voice-enabled device platform configured to perform echo cancellation, in accordance with certain embodiments of the present disclosure.

FIG. 6 illustrates an example voice-enabled device platform 600, configured in accordance with certain embodiments of the present disclosure, to provide reduction of echo in a received audio signal based on IIR acoustic echo cancellation in the frequency domain. In some embodiments, platform 600 may be hosted on, or otherwise be incorporated into a personal computer, workstation, server system, smart home management system, laptop computer, ultra-laptop computer, tablet, touchpad, portable computer, handheld computer, palmtop computer, personal digital assistant (PDA), cellular telephone, combination cellular telephone and PDA, smart device (for example, smartphone, smart-speaker, or smart-tablet), mobile internet device (MID), messaging device, data communication device, wearable device, embedded system, and so forth. Any combination of different devices may be used in certain embodiments.

In some embodiments, platform 600 may comprise any combination of a processor 620, a memory 630, echo cancellation system 130, speech processing applications 610, a network interface 640, an input/output (I/O) system 650, a user interface 660, a microphone 106, a speaker 108, and a storage system 670. As can be further seen, a bus and/or interconnect 692 is also provided to allow for communication between the various components listed above and/or other components not shown. Platform 600 can be coupled to a network 694 through network interface 640 to allow for communications with other computing devices, platforms, devices to be controlled, or other resources. Other componentry and functionality not reflected in the block diagram of FIG. 6 will be apparent in light of this disclosure, and it will be appreciated that other embodiments are not limited to any particular hardware configuration.

Processor 620 can be any suitable processor, and may include one or more coprocessors or controllers, such as an audio processor, a graphics processing unit, or hardware accelerator, to assist in control and processing operations associated with platform 600. In some embodiments, the processor 620 may be implemented as any number of processor cores. The processor (or processor cores) may be any type of processor, such as, for example, a microprocessor, an embedded processor, a digital signal processor (DSP), a graphics processor (GPU), a tensor processing unit (TPU), a network processor, a field programmable gate array or other device configured to execute code. The processors may be multithreaded cores in that they may include more than one hardware thread context (or "logical processor") per core. Processor 620 may be implemented as a complex instruction set computer (CISC) or a reduced instruction set computer (RISC) processor. In some embodiments, processor 620 may be configured as an x86 instruction set compatible processor.

Memory 630 can be implemented using any suitable type of digital storage including, for example, flash memory and/or random-access memory (RAM). In some embodiments, the memory 630 may include various layers of memory hierarchy and/or memory caches as are known to those of skill in the art. Memory 630 may be implemented as a volatile memory device such as, but not limited to, a RAM, dynamic RAM (DRAM), or static RAM (SRAM) device. Storage system 670 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage 670 may comprise technology to increase the storage performance enhanced protection for valuable digital media when multiple hard drives are included.

Processor 620 may be configured to execute an Operating System (OS) 680 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS). As will be appreciated in light of this disclosure, the techniques provided herein can be implemented without regard to the particular operating system provided in conjunction with platform 600, and therefore may also be implemented using any suitable existing or subsequently-developed platform.

Network interface circuit 640 can be any appropriate network chip or chipset which allows for wired and/or wireless connection between other components of device platform 600 and/or network 694, thereby enabling platform 600 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 650 may be configured to interface between various I/O devices and other components of device platform 600. I/O devices may include, but not be limited to, user interface 660, microphone 106, and speaker 108. User interface 660 may include devices (not shown) such as a display element, touchpad, keyboard, and mouse, etc. I/O system 650 may include a graphics subsystem configured to perform processing of images for rendering on the display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 620 or any chipset of platform 600.

It will be appreciated that in some embodiments, the various components of platform 600 may be combined or integrated in a system-on-a-chip (SoC) architecture. In some embodiments, the components may be hardware components, firmware components, software components or any suitable combination of hardware, firmware or software.

Echo cancellation system 130 is configured to enhance the quality of a received speech signal through echo cancellation, as described previously. The enhanced speech signal may be provided to speech processing applications 610 for improved performance. Echo cancellation system 130 may include any or all of the circuits/components illustrated in FIGS. 1-4, as described above. These components can be implemented or otherwise used in conjunction with a variety of suitable software and/or hardware that is coupled to or that otherwise forms a part of platform 600. These components can additionally or alternatively be implemented or otherwise used in conjunction with user I/O devices that are capable of providing information to, and receiving information and commands from, a user.

In some embodiments, these circuits may be installed local to platform 600, as shown in the example embodiment of FIG. 6. Alternatively, platform 600 can be implemented in a client-server arrangement wherein at least some functionality associated with these circuits is provided to platform 600 using an applet, such as a JavaScript applet, or other downloadable module or set of sub-modules. Such remotely accessible modules or sub-modules can be provisioned in real-time, in response to a request from a client computing system for access to a given server having resources that are of interest to the user of the client computing system. In such embodiments, the server can be local to network 694 or remotely coupled to network 694 by one or more other networks and/or communication channels. In some cases, access to resources on a given network or computing system may require credentials such as usernames, passwords, and/or compliance with any other suitable security mechanism.

In various embodiments, platform 600 may be implemented as a wireless system, a wired system, or a combination of both. When implemented as a wireless system, platform 600 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, platform 600 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the echo cancellation methodologies disclosed herein to be implemented. The instructions can be encoded using a suitable programming language, such as C, C++, object oriented C, Java, JavaScript, Visual Basic .NET, Beginner's All-Purpose Symbolic Instruction Code (BASIC), or alternatively, using custom or proprietary instruction sets. The instructions can be provided in the form of one or more computer software applications and/or applets that are tangibly embodied on a memory device, and that can be executed by a computer having any suitable architecture. In one embodiment, the system can be hosted on a given website and implemented, for example, using JavaScript or another suitable browser-based technology. For instance, in certain embodiments, the system may leverage processing resources provided by a remote computer system accessible via network 694. In other embodiments, the functionalities disclosed herein can be incorporated into other voice-enabled devices and speech-based software applications, such as, for example, automobile control/navigation, smart-home management, entertainment, personal assistant, and robotic applications. The computer software applications disclosed herein may include any number of different modules, sub-modules, or other components of distinct functionality, and can provide information to, or receive information from, still other components. These modules can be used, for example, to communicate with input and/or output devices such as a display screen, a touch sensitive surface, a printer, and/or any other suitable device. Other componentry and functionality not reflected in the illustrations will be apparent in light of this disclosure, and it will be appreciated that other embodiments are not limited to any particular hardware or software configuration. Thus, in other embodiments platform 600 may comprise additional, fewer, or alternative subcomponents as compared to those included in the example embodiment of FIG. 6.

The aforementioned non-transitory computer readable medium may be any suitable medium for storing digital information, such as a hard drive, a server, a flash memory, and/or random-access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method, process, and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CD-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical entities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), desktop computers, laptop computers, tablet computers, servers, smartphones, etc. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is a processor-implemented method for reducing echo in an audio signal, the method comprising: generating, by a processor-based system, coefficients of an infinite impulse response (IIR) filter in the frequency domain and coefficients of a finite impulse response (FIR) filter, the IIR filter and the FIR filter to estimate an echo path transfer function associated with a received audio signal, the received audio signal including a combination of (1) a speech signal and (2) a modified reference signal, the modified reference signal resulting from transformation of a reference signal by the echo path transfer function, wherein the IIR filter is configured to model longer term echo components and the FIR filter is configured to model shorter term echo components; applying, by the processor-based system and in the frequency domain, the IIR filter and the FIR filter to the reference signal, to generate an echo correction signal; and subtracting, by the processor-based system, the echo correction signal from the received audio signal to reduce echo in the received audio signal and to generate an estimate of the speech signal.

Example 2 includes the subject matter of Example 1, wherein generating the coefficients of the IIR filter includes generating the coefficients of the IIR filter based on recursive estimates of second order statistics of the reference signal and the received audio signal.

Example 3 includes the subject matter of Examples 1 or 2, wherein the estimates of the second order statistics of the received audio signal are performed during time periods associated with an absence of the speech signal.

Example 4 includes the subject matter of any of Examples 1-3, further comprising detecting instability associated with the IIR filter based on a comparison of a short-term variance of the estimated speech signal to a short-term variance of a difference between the received audio signal and an output of the FIR filter, and resetting the coefficients of the IIR filter to zero values in response to the detection.

Example 5 includes the subject matter of any of Examples 1-4, wherein generating the coefficients of the FIR filter includes generating the coefficients of the FIR filter based on least squares minimization of variance of an estimate of the speech signal.

Example 6 includes the subject matter of any of Examples 1-5, wherein the processor-based system is a smartphone and the reference signal is generated by a speaker of the smartphone during a voice call in speakerphone mode.

Example 7 includes the subject matter of any of Examples 1-6, wherein the processor-based system is a smart-speaker system and the reference signal is generated by playing selected audio content.

Example 8 is a system for reducing echo in an audio signal, the system comprising: a frequency domain based infinite impulse response (IIR) filter to model longer term echo components of a received audio signal, the received audio signal including a combination of (1) a speech signal and (2) a modified reference signal, the modified reference signal resulting from transformation of a reference signal by the echo path transfer function; a frequency domain based finite impulse response (FIR) filter to model shorter term echo components of the received audio signal; and a summing circuit to subtract an echo correction signal from the received audio signal to reduce the echo in the received audio signal to generate an estimate of the speech signal, the echo correction signal generated by applying, in the frequency domain, the IIR filter and the FIR filter to the reference signal.

Example 9 includes the subject matter of Example 8, further comprising an IIR filter coefficient update circuit to generate coefficients of the IIR filter based on recursive estimates of second order statistics of the reference signal and the received audio signal.

Example 10 includes the subject matter of Examples 8 or 9, wherein the estimates of the second order statistics of the received audio signal are performed during time periods associated with an absence of the speech signal.

Example 11 includes the subject matter of any of Examples 8-10, further comprising an instability detection/correction circuit to detect instability associated with the IIR filter based on a comparison of a short-term variance of the estimated speech signal to a short-term variance of a difference between the received audio signal and an output of the FIR filter, and to reset the coefficients of the IIR filter to zero values in response to the detection Example 12 includes the subject matter of any of Examples 8-11, further comprising an FIR filter coefficient update circuit to generate coefficients of the FIR filter based on least squares minimization of variance of an estimate of the speech signal.

Example 13 includes the subject matter of any of Examples 8-12, wherein the system is a smartphone and the reference signal is generated by a speaker of the smartphone during a voice call in speakerphone mode.

Example 14 includes the subject matter of any of Examples 8-13, wherein the system is a smart-speaker system and the reference signal is generated by playing selected audio content.

Example 15 is at least one non-transitory computer readable storage medium having instructions encoded thereon that, when executed by one or more processors, cause a process to be carried out for reducing echo in an audio signal, the process comprising: generating coefficients of an infinite impulse response (IIR) filter and coefficients of a finite impulse response (FIR) filter in the frequency domain, the IIR filter and the FIR filter to estimate an echo path transfer function associated with a received audio signal, the received audio signal including a combination of (1) a speech signal and (2) a modified reference signal, the modified reference signal resulting from transformation of a reference signal by the echo path transfer function, wherein the IIR filter is configured to model longer term echo components and the FIR filter is configured to model shorter term echo components; applying, in the frequency domain, the IIR filter and the FIR filter to the reference signal, to generate an echo correction signal; and subtracting the echo correction signal from the received audio signal to reduce echo in the received audio signal and to generate an estimate of the speech signal.

Example 16 includes the subject matter of Example 15 wherein generating the coefficients of the IIR filter includes generating the coefficients of the IIR filter based on recursive estimates of second order statistics of the reference signal and the received audio signal.

Example 17 includes the subject matter of Examples 15 or 16, wherein the estimates of the second order statistics of the received audio signal are performed during time periods associated with an absence of the speech signal.

Example 18 includes the subject matter of any of Examples 15-17, wherein the process further comprises detecting instability associated with the IIR filter based on a comparison of a short-term variance of the estimated speech signal to a short-term variance of a difference between the received audio signal and an output of the FIR filter, and resetting the coefficients of the IIR filter to zero values in response to the detection.

Example 19 includes the subject matter of any of Examples 15-18, wherein generating the coefficients of the FIR filter includes generating the coefficients of the FIR filter based on least squares minimization of variance of an estimate of the speech signal.

Example 20 includes the subject matter of any of Examples 15-19, wherein a processor-based system is a smartphone and the reference signal is generated by a speaker of the smartphone during a voice call in speakerphone mode.

Example 21 includes the subject matter of any of Examples 15-20, wherein a processor-based system is a smart-speaker system and the reference signal is generated by playing selected audio content.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. A processor-implemented method for reducing echo in an audio signal, the method comprising:
    generating, by a processor-based system, coefficients of an infinite impulse response (IIR) filter in the frequency domain and coefficients of a finite impulse response (FIR) filter, the IIR filter and the FIR filter to estimate an echo path transfer function associated with a received audio signal, the received audio signal including a combination of (1) a speech signal and (2) a modified reference signal, the modified reference signal resulting from transformation of a reference signal by the echo path transfer function, wherein the IIR filter is configured to model longer term echo components and the FIR filter is configured to model shorter term echo components;
    applying, by the processor-based system and in the frequency domain, the IIR filter and the FIR filter to the reference signal, to generate an echo correction signal; and
    subtracting, by the processor-based system, the echo correction signal from the received audio signal to reduce echo in the received audio signal and to generate an estimate of the speech signal.

2. The method of claim 1, wherein generating the coefficients of the IIR filter includes generating the coefficients of the IIR filter based on recursive estimates of second order statistics of the reference signal and the received audio signal.

3. The method of claim 2, wherein the estimates of the second order statistics of the received audio signal are performed during time periods associated with an absence of the speech signal.

4. The method of claim 1, further comprising detecting instability associated with the IIR filter based on a comparison of a short-term variance of the estimated speech signal to a short-term variance of a difference between the received audio signal and an output of the FIR filter, and resetting the coefficients of the IIR filter to zero values in response to the detection.

5. The method of claim 1, wherein generating the coefficients of the FIR filter includes generating the coefficients of the FIR filter based on least squares minimization of variance of an estimate of the speech signal.

6. The method of claim 1, wherein the processor-based system is a smartphone and the reference signal is generated by a speaker of the smartphone during a voice call in speakerphone mode.

7. The method of claim 1, wherein the processor-based system is a smart-speaker system and the reference signal is generated by playing selected audio content.

8. A system for reducing echo in an audio signal, the system comprising:
    a frequency domain based infinite impulse response (IIR) filter to model longer term echo components of a received audio signal, the received audio signal including a combination of (1) a speech signal and (2) a modified reference signal, the modified reference signal resulting from transformation of a reference signal by an echo path transfer function;
    a frequency domain based finite impulse response (FIR) filter to model shorter term echo components of the received audio signal; and
    a summing circuit to subtract an echo correction signal from the received audio signal to reduce the echo in the received audio signal to generate an estimate of the speech signal, the echo correction signal generated by applying, in the frequency domain, the IIR filter and the FIR filter to the reference signal.

9. The system of claim 8, further comprising an IIR filter coefficient update circuit to generate coefficients of the IIR filter based on recursive estimates of second order statistics of the reference signal and the received audio signal.

10. The system of claim 9, wherein the estimates of the second order statistics of the received audio signal are performed during time periods associated with an absence of the speech signal.

11. The system of claim 8, further comprising an instability detection/correction circuit to detect instability associated with the IIR filter based on a comparison of a short-term variance of the estimated speech signal to a short-term variance of a difference between the received audio signal and an output of the FIR filter, and to reset the coefficients of the IIR filter to zero values in response to the detection.

12. The system of claim 8, further comprising an FIR filter coefficient update circuit to generate coefficients of the FIR filter based on least squares minimization of variance of an estimate of the speech signal.

13. The system of claim 8, wherein the system is a smartphone and the reference signal is generated by a speaker of the smartphone during a voice call in speakerphone mode.

14. The system of claim 8, wherein the system is a smart-speaker system and the reference signal is generated by playing selected audio content.

15. At least one non-transitory computer readable storage medium having instructions encoded thereon that, when executed by one or more processors, cause a process to be carried out for reducing echo in an audio signal, the process comprising:
    generating coefficients of an infinite impulse response (IIR) filter and coefficients of a finite impulse response (FIR) filter in the frequency domain, the IIR filter and the FIR filter to estimate an echo path transfer function associated with a received audio signal, the received audio signal including a combination of (1) a speech signal and (2) a modified reference signal, the modified reference signal resulting from transformation of a reference signal by the echo path transfer function, wherein the IIR filter is configured to model longer term echo components and the FIR filter is configured to model shorter term echo components;

applying, in the frequency domain, the IIR filter and the FIR filter to the reference signal, to generate an echo correction signal; and subtracting the echo correction signal from the received audio signal to reduce echo in the received audio signal and to generate an estimate of the speech signal.

16. The computer readable storage medium of claim 15, wherein generating the coefficients of the IIR filter includes generating the coefficients of the IIR filter based on recursive estimates of second order statistics of the reference signal and the received audio signal.

17. The computer readable storage medium of claim 16, wherein the estimates of the second order statistics of the received audio signal are performed during time periods associated with an absence of the speech signal.

18. The computer readable storage medium of claim 15, wherein the process further comprises detecting instability associated with the IIR filter based on a comparison of a short-term variance of the estimated speech signal to a short-term variance of a difference between the received audio signal and an output of the FIR filter, and resetting the coefficients of the IIR filter to zero values in response to the detection.

19. The computer readable storage medium of claim 15, wherein generating the coefficients of the FIR filter includes generating the coefficients of the FIR filter based on least squares minimization of variance of an estimate of the speech signal.

20. The computer readable storage medium of claim 15, wherein a processor-based system is a smartphone and the reference signal is generated by a speaker of the smartphone during a voice call in speakerphone mode.

21. The computer readable storage medium of claim 15, wherein a processor-based system is a smart-speaker system and the reference signal is generated by playing selected audio content.

* * * * *